United States Patent [19]

Chen et al.

[11] Patent Number: 5,432,723
[45] Date of Patent: Jul. 11, 1995

[54] PARALLEL INFINITE IMPULSE RESPONSE (IIR) FILTER WITH LOW QUANTIZATION EFFECTS AND METHOD THEREFOR

[75] Inventors: Wei Chen; Sangil Park, both of Austin, Tex.

[73] Assignee: Motorola, Inc., Schaumburg, Ill.

[21] Appl. No.: 160,638

[22] Filed: Dec. 2, 1993

[51] Int. Cl.$^6$ ............................................. G06F 15/31
[52] U.S. Cl. ............................ 364/724.01; 364/724.17
[58] Field of Search ..................... 364/724.01, 724.17, 364/724.16

[56] References Cited

U.S. PATENT DOCUMENTS

| | | | |
|---|---|---|---|
| 4,185,325 | 1/1980 | Appel | 364/724.17 |
| 4,255,794 | 3/1981 | Nakayama | 364/724.17 |
| 4,305,133 | 12/1981 | Amada et al. | 364/724.17 |
| 4,811,263 | 3/1987 | Hedley et al. | 364/724.17 |
| 5,189,634 | 2/1993 | Eberle et al. | 364/724.17 |

OTHER PUBLICATIONS

Leland B. Jackson; "Digital Filters and Signal Processing;" University of Rhode Island; pp. 195–204, (1986).
T. W. Parks; "Digital Filter Design;" School of Electrical Engineering, Cornell University; pp. 238–239, (1987).

*Primary Examiner*—Roy N. Envall, Jr.
*Assistant Examiner*—Emmanuel L. Moise
*Attorney, Agent, or Firm*—Paul J. Polansky

[57] ABSTRACT

A parallel IIR filter (100) has low quantization effects and includes a multiplier (103) which multiplies a digital input signal by a constant, and an arbitrary number of biquad filters (104, 105). Outputs of the multiplier (103) and each biquad filter (104, 105) are summed together in a summing device (106) to provide an output signal of the IIR filter (100). The IIR filter (100) first expresses its transfer function as a cascade form transfer function, and then calculates the constant as a product of a constant term of each cascade form biquad term. The IIR filter (100) partially decomposes the cascade form transfer function to provide first order terms, and calculates numerator coefficients of the first-order terms. Pairs of decomposed terms are recombined to provide a parallel form transfer function, from which parallel form coefficients are taken and applied to the biquad filters (104, 105).

16 Claims, 5 Drawing Sheets

PARALLEL INFINITE IMPULSE RESPONSE (IIR) FILTER WITH LOW QUANTIZATION EFFECTS AND METHOD THEREFOR

CROSS REFERENCE TO RELATED APPLICATION

Related subject matter is contained in a patent application, Ser. No. 08/160,640, now abandoned, entitled "Digital Filter with Low Quantization Effects and Method Therefor", by Wei Chen and Sangil Park, filed of even date herewith, and assigned to the assignee hereof.

FIELD OF THE INVENTION

This invention relates generally to electrical filters, and more particularly, to digital filters.

BACKGROUND OF THE INVENTION

Infinite impulse response (IIR) digital filter structures have been studied for more than thirty years. IIR filters generally fall into two types, cascade and parallel. The parallel IIR filter theoretically provides less noise, i.e., provides a higher signal-to-noise ratio. However, for two major reasons most IIR filters are nonetheless implemented using the cascade form. First, the parallel form is considered to be computationally expensive. See, for example, L. Jackson, *Digital Filters and Signal Processing*, Kluwer Academic Publishers, 1986, at page 202. The cascade IIR filter requires 25–50 percent fewer multiply operations than required for the parallel IIR filter, thus saving processing hardware and instruction cycles. For these practical reasons, the cascade form is often preferred.

Second, known parallel IIR filters suffer from reduced performance due to quantization errors. These quantization errors reduce signal-to-noise ratio (SNR) and can arise from two sources. First, commercially-available digital signal processors (DSPs) can create quantization errors when implementing the biquad filters of the IIR filter. The microelectronics revolution has provided DSPs with sophisticated data addressing modes and high arithmetic precision. Nonetheless, commercially available DSPs do not provide the precision required to avoid creating quantization errors. While these DSPs perform the repetitive arithmetic operations required for IIR filters in a high-precision arithmetic logic unit (ALU), sometimes the precision is lost. For example, the high operand precision is lost when an operand must be stored in memory to implement a time delay. This lost precision results in quantization error.

Second, quantization errors occur when the IIR filter polynomial is decomposed to determine the parallel form coefficients. The desired transfer function of the filter is easily expressed in cascade form, that is, as a product of some number of biquad terms. Determination of cascade-form coefficients is easy because only second-order decomposition of each biquad term is involved. In theory, the parallel form of the transfer function can be obtained directly from the cascade form. However, in practice it is very difficult to generate parallel-form filter coefficients directly from the cascade form transfer function. Conversion from the given cascade filter coefficients to the parallel filter coefficients involves a large number of multiplications and divisions. As the number of computations increases, quantization errors accumulate. The coefficient inaccuracies due to the accumulated quantization errors may also cause stability problems. In the parallel IIR filter, the placement of the filter's zeros depends on cancellation of terms in a summation operation, and thus is more sensitive to coefficient quantization. Inaccurate coefficient quantization may cause the zeros to move off of the unit circuit and ultimately cause the parallel-form IIR filter to be unstable.

Thus, both conventional methods to decompose the polynomial and sum the decomposed terms, and known biquad filter structures, require very high precision processing. When very high precision processing is not practical, quantization errors result, lowering performance below theoretical potential. What is needed, then, is a new parallel IIR filter which solve the aforementioned problems and may be implemented using commercially available DSPs with minimum cost.

SUMMARY OF THE INVENTION

Accordingly, the present invention provides, in one form, a parallel Infinite impulse response (IIR) filter with low quantization effects, including a multiplier, a plurality of digital biquad filters, an output summing device, and a data processing apparatus. The multiplier has a constant associated therewith, and has an input terminal for receiving a digital signal, and an output terminal for providing a first intermediate signal. Each digital biquad filter has an input terminal for receiving the digital signal, and an output terminal for providing a corresponding intermediate biquad signal. The output summing device has a first input terminal coupled to the output terminal of the multiplier, second input terminals coupled to output terminals of each digital biquad filter, and an output terminal for providing an output signal of the IIR filter. The data processing apparatus is operatively coupled to the multiplier, and expresses a transfer function of the parallel IIR filter as a cascade form transfer function. The cascade form transfer function is a product of a plurality of cascade form biquad terms, each cascade form biquad term having a numerator and a denominator. The data processing apparatus further calculates the constant as a product of a constant term of each of the plurality of cascade form biquad terms and applies the constant to the multiplier. The parallel IIR filter filters the digital input signal using the multiplier as determined by the constant.

In another form, the invention provides a method for filtering a digital input signal using a parallel infinite impulse response (IIR) filter. A transfer function of the parallel IIR filter is expressed as a cascade form transfer function. The cascaded form transfer function is a product of a plurality of cascade form biquad terms, each cascade form biquad term having a numerator and a denominator. Each cascade form biquad term is decomposed to provide a plurality of first-order terms corresponding thereto. First and second intermediate numerator coefficients are calculated for each first-order term. Pairs of the plurality of first-order terms are combined to provide a plurality of parallel form biquad terms. First and second numerator coefficients and first and second denominator coefficients of each parallel form biquad term are applied to corresponding ones of a plurality of biquad filters of the parallel IIR filter. A digital input signal is filtered with the parallel IIR filter to provide a digital output signal using the plurality of biquad filters as determined by corresponding first and second numerator coefficients and corresponding first and second denominator coefficients.

DETAILED DESCRIPTION OF A PREFERRED EMBODIMENT

Figure 1:
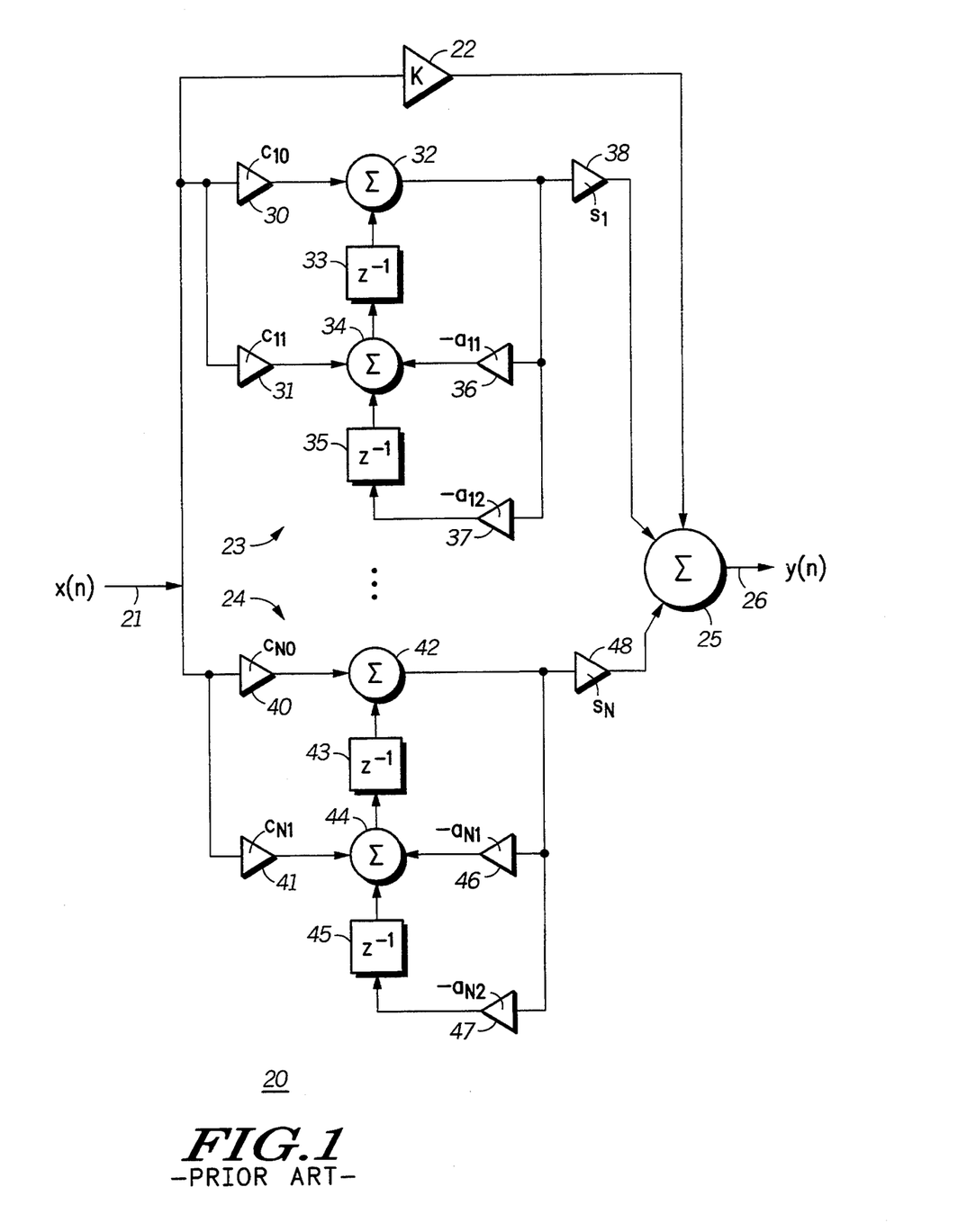
FIG. 1 illustrates in partial block diagram and partial logic diagram form a parallel infinite impulse response (IIR) filter known in the prior art.

FIG. 1 illustrates in partial block diagram and partial logic diagram form a parallel infinite impulse response (IIR) filter 20 known in the prior art. Filter 20 includes generally an input terminal 21, a multiplier 22, N biquad filters, where N is an arbitrary integer, including representative biquad filters 23 and 24, a summing device 25, and an output terminal 26. Input terminal 21 is an input terminal for receiving a digital signal to be filtered, labelled "x(n)". Multiplier 22 has an input terminal for receiving signal x(n), and an output terminal for providing a digital signal equal to input signal x(n) multiplied by a coefficient labelled "K". Each biquad filter, including biquad filters 23 and 24, has an input terminal for receiving x(n), and an output terminal. Summing device 25 has a first input terminal connected to the output terminal of multiplier 22, N additional input terminals connected to output terminals of each of the N biquad filters in IIR filter 20, and an output terminal connected to output terminal 26 of filter 20 for providing a digital output signal labelled "y(n)".

Biquad filter 23 includes multipliers 30 and 31, a summing device 32, a delay element 33, a summing device 34, a delay element 35, and multipliers 36–38. Multiplier 30 has an input terminal for receiving signal x(n), and an output terminal for providing a digital signal equal to signal x(n) multiplied by a coefficient labelled "$c_{10}$". Multiplier 31 has an input terminal for receiving signal x(n), and an output terminal for providing a digital signal equal to signal x(n) multiplied by a coefficient labelled "$c_{11}$". Summing device 32 has a first input terminal connected to the output terminal of multiplier 30, a second input terminal, and an output terminal. Delay element 33 has an input terminal, and an output terminal connected to the second input terminal of summing device 32. Summing device 34 has a first input terminal connected to the output terminal of multiplier 31, second and third input terminals, and an output terminal connected to the input terminal of delay element 33. Delay element 35 has an input terminal, and an output terminal connected to the second input terminal of summing device 34. Multiplier 36 has an input terminal connected to the output terminal of summing device 32, and an output terminal connected to the third input terminal of summing device 34 for providing a digital signal equal to an input thereof multiplied by a coefficient labelled "$-a_{11}$". Multiplier 37 has an input terminal connected to the output terminal of summing device 32, and an output terminal connected to the input terminal of delay element 35 for providing a digital signal equal to an input thereof multiplied by a coefficient labelled "$-a_{12}$". Multiplier 38 has an input terminal connected to the output terminal of summing device 32, and an output terminal connected to a corresponding input terminal of summing device 25 for providing a digital signal equal to an input thereof multiplied by a coefficient labelled "$s_1$".

Each biquad filter in IIR filter 20 is structurally identical to filter 23, but has different coefficients associated therewith. For example, biquad filter 24 includes multipliers 40 and 41, a summing device 42, a delay element 43, a summing device 44, a delay element 45, and multipliers 46–48. Each of elements 40–48 corresponds to elements 30–38 and the structure of biquad 24 will not be further discussed. Biquad filter 24 differs from biquad filter 23 in that multipliers 40, 41, 46, 47, and 48 have coefficients labelled "$c_{N0}$", "$c_{N1}$", "$-a_{N1}$", "$-a_{N2}$", and "$s_N$", respectively, associated therewith.

Filter 20 is a parallel IIR filter structure taught by L. Jackson, *Digital Filters and Signal Processing*, Kluwer Academic Publishers, 1986, at p. 198. The transfer function H(z) is expressed as:

$$H(z) = K + \sum_{i=1}^{N} \left( \frac{c_{i0} + c_{i1} z^{-1}}{1 + a_{i1} z^{-1} + a_{i2} z^{-2}} \right) \quad [1]$$

Each biquad filter such as biquad filter 23 requires two adders (adders 32 and 34), two delay elements (delay elements 33 and 35), four coefficients (applied by multipliers 30, 31 36, and 37), and a scaling factor (applied by multiplier 38). Input signal x(n) is provided to each biquad filter in filter 20 via signal line 21. The output of biquad filter 23, for example, is not only accumulated in summing device 25 (after scaling), but is also fed back to provide inputs to multipliers 36 and 37. Delay element 33 delays the output of summing device 34 by one sample period, and provides the delayed signal to summing device 32.

Typically, digital signal processing systems implement delay elements by storing the input of the delay element in a memory location for one sample period. However, commercially available DSPs have on-board arithmetic hardware, such as accumulators, which have greater word lengths than memory. For example, the 56000-family DSPs available from Motorola, Inc. have a memory word length of 24 bits, but an on-board 56-bit accumulator. Quantization errors occur when the output of such an accumulator is truncated or rounded to 24 bits, e.g., when the accumulator output is written to memory. In biquad filter 23, after a delay of one sample period, the truncated 24-bit output of delay element 33 is added to the output of multiplier 30 in summing device 32. The output of summing device 32 is then scaled in multiplier 38 and added to the outputs of the remaining biquad filters in final summing device 25.

Filter 20 causes quantization errors at four points in each biquad filter. Quantization errors are introduced at the outputs of delay elements 35 and 33 because the inputs thereof are stored in 24-bit memory for one sample period. A third quantization error is created at the inputs of multipliers 36 and 37 because the operands must be truncated to 24 bits to be input to a 24-bit by 24-bit hardware multiplier. A fourth quantization error occurs at the input of multiplier 38, also due to the hardware multiplier operand size. In addition, filter 20 causes a quantization error at the output of summing device 25 at output terminal 26. Thus, in general, filter 20 causes a total of $4N+1$ quantization errors for an N-section, second-order parallel IIR filter. These quantization errors introduce noise into output signal $y(n)$.

Filter 20 suffers from two other problems. The complicated signal flow of each biquad filter increases the number of instructions and memory locations for the signal processing system. Furthermore, a scaling factor must be calculated and applied for each biquad filter output, which increases noise on output signal $y(n)$ and increases the number of instructions and memory locations for the signal processing system.

Filter 20 also suffers problems caused by known methods of calculating the numerator coefficients $c_{i0}$ and $c_{i1}$, the denominator coefficients $a_{i1}$ and $a_{i2}$, and constant K. According to these known methods, the transfer function $H(z)$ is first expressed in cascade form, that is, as a product rather than a sum of biquad terms. Then, the denominator of this transfer function is expanded into a single polynomial, whose roots are then determined. Once the roots of the denominator are determined, numerator coefficients and coefficient K may be determined. One problem is that this technique causes serious quantization errors in coefficient K because of the complex calculations involved. Another problem is that the roots of the denominator are not exact due to quantization errors, and thus they distort the desired transfer function and may cause instability problems. What is needed is a parallel IIR filter which overcomes these problems when implemented with commercially available DSPs.

Figure 2:
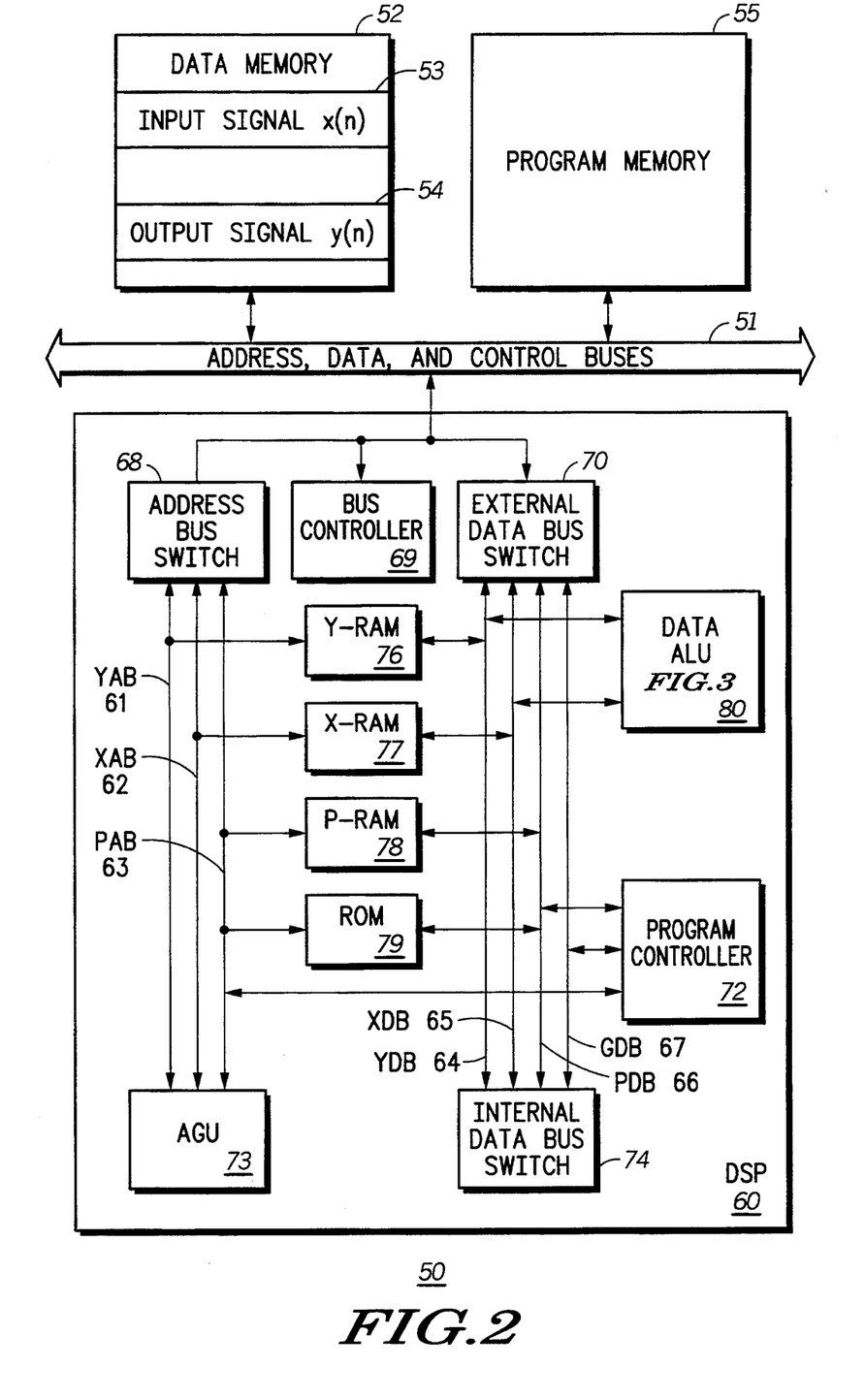
FIG. 2 illustrates in block diagram form a digital signal processing system implementing a parallel IIR filter according to the present invention.

FIG. 2 illustrates in block diagram form a digital signal processing system 50 implementing a parallel IIR filter according to the present invention. System 50 includes generally an address, data, and control bus 51, a data memory 52, a program memory 55, and a digital signal processor (DSP) 60. Bus 51 is a bus allowing DSP 60 to address locations in data memory 52 and program memory 55. System 50 implements a virtual Harvard architecture. In the Harvard architecture, a data processor has separate buses for accessing program and data memory spaces. System 50 has separate program and data memory spaces, but accesses external memory through a single physical bus 51.

Data memory 52 is a block of sequential random access memory (RAM) addresses including a first memory location 53 for storing an input data signal $x(n)$, and a second memory location 54 for storing output data signal $y(n)$. The ultimate source and destination of signals $x(n)$ and $y(n)$, respectively, will vary from application to application. For example, if system 50 is used in a compact disc (CD) player, input signal $x(n)$ will be an audio data sample read from the CD at a rate of 44.1 kilohertz (kHz), and $y(n)$ will be a processed, audio output signal. Thus, FIG. 2 does not show other elements of system 50 which are necessary for its intended application, such as the digital-to-analog converter (DAC) and power amplifier necessary to output signal $y(n)$ to a loudspeaker.

Program memory 55 includes sequential memory locations for storing a program in the form of instructions which are decoded by DSP 60. A portion of program memory 55 controls the operation of DSP 60 to implement an IIR filter according to the present invention. In the illustrated embodiment, a separate computing system (not shown) calculates the parallel form coefficients and transfers them to program memory 55. APPENDIX A lists this coefficient calculation routine, whose operation will be further explained in conjunction with FIGS. 4 and 5 below. In another embodiment, such as when system 50 implements an adaptive IIR filter, program memory 55 would preferably include the coefficient calculation routine to periodically adapt the coefficients.

DSP 60 is a general-purpose digital signal processor which has a high degree of internal parallelism in order to execute data processing instructions most useful in signal processing functions efficiently. In the illustrated embodiment, DSP 60 is a DSP56002 available from Motorola, Inc. However, the architectural features of DSP 60 which make an IIR filter according to the present invention advantageous are shared by most commercially available DSPs.

DSP 60 includes generally a set of three internal address buses including a Y address bus labelled "YAB" 61, an X address bus labelled "XAB" 62, and a program address bus labelled "PAB" 63. In addition, DSP 60 includes three data buses corresponding to the address buses, labelled "YDB" 64, "XDB" 65, and "PDB" 66, and an additional global data bus labelled "GDB" 67. An address generation unit (AGU) 73 generates addresses conducted on YAB 61, XAB 62, and PAB 63 using several addressing modes, including modulo addressing. An address bus switch 68 then selectively conducts these address signals externally onto bus 51 in order for DSP 60 to address data memory 52 and program memory 55, as controlled by a bus controller 69. These address signals are also conducted internally to four on-chip memories, which include a Y-RAM 76 connected to YAB 61, an X-RAM 77 connected to XAB 62, a program-RAM (P-RAM) 78 connected to PAB 63, and a read only memory (ROM) 79 connected to PAB 63 for storing a bootstrap program.

Data buses YDB 64, XDB 65, PDB 66, and GDB 67 are connected externally to bus 51 by an external data bus switch 70 to read data from or write data to data memory 52, and to read data from program memory 55, as controlled by bus controller 69. An internal data bus switch 74 is also connected to the data buses to swap data between the buses. Each on-chip memory is connected to a corresponding data bus; Y-RAM 76 to and from YDB 64, X-RAM 77 to and from XDB 65, P-RAM 78 to PDB 66, and ROM 79 to PDB 66. A program controller 72 has bidirectional connections to PDB 66, GDB 67, and PAB 63 to receive and decode instructions and provide corresponding data values to an appropriate bus. Note that FIG. 2 does not show additional elements such as peripherals and input/output ports which are present in system 50.

In order to perform signal processing instructions, DSP 60 also includes a data arithmetic logic unit (ALU) 80. Data ALU 80 has bidirectional connections to YDB 64 and XDB 65 and operates under the direction of program controller 72. Data ALU 80 includes arithmetic hardware circuitry which allows DSP 60 to perform common signal-processing instructions efficiently, including a multiplier/accumulator for performing multiply/accumulate (MAC) instructions efficiently. MAC instructions are frequently encountered in IIR filters, FIR filters, and the like.

To keep cost low, like similar elements in most other commercially available DSPs, data ALU 80 uses a double data size plus guard bits in its accumulator. In DSP 60, the data size is 24 bits, and the accumulator has 2 24 bits plus an extra 8 guard bits for overflow protection for a total of 56 bits. Therefore, whenever a data element is moved from the accumulator onto the memory buses, the least significant 24 bits and most significant 8 bits are not moved onto the buses. These lost bits cause quantization error.

Figure 3:
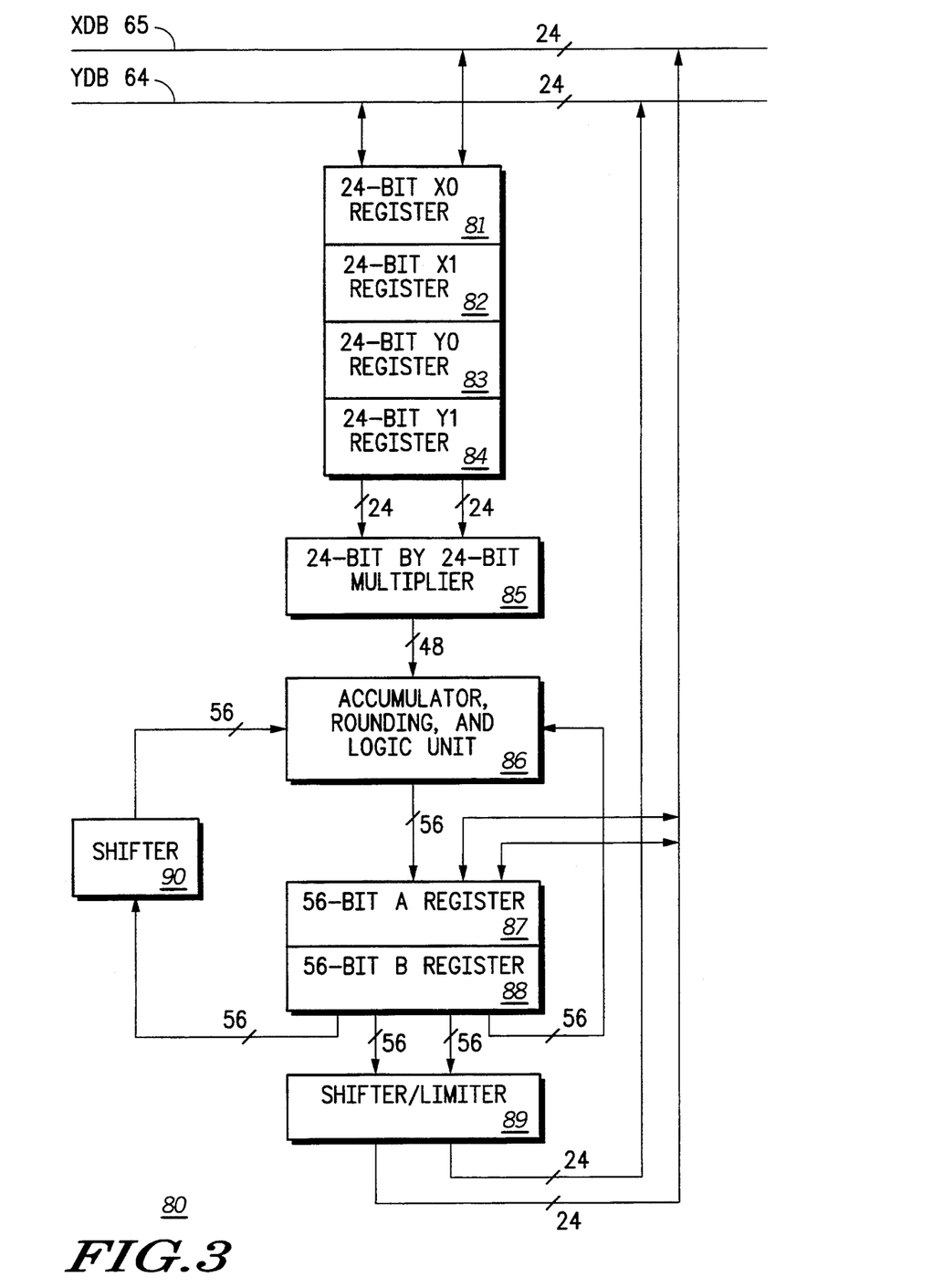
FIG. 3 illustrates in block diagram form the data arithmetic logic unit (ALU) of FIG. 3.

Data ALU 80 is better understood with reference to FIG. 3, which illustrates in block diagram form data ALU 80 of FIG. 2. Data ALU 80 includes four local 24-bit registers, including an X0 REGISTER 81, an X1 REGISTER 82, a Y0 REGISTER 83, and a Y1 REGISTER 84. Each of registers 81 and 82 has a bidirectional connection to XDB 65, whereas each of registers 83 and 84 has a bidirectional connection to YDB 64.

Each X register has a connection to a first 24-bit input of a multiplier 85, and each Y register has a connection to a second 24-bit input of multiplier 85. Multiplier 85 is a high-speed recoded multiplier for high-speed multiplications. Multiplier 85 provides a 48-bit output to an accumulator, rounding, and logic unit 86. Accumulator, rounding, and logic unit 86 is a 56-bit accumulator, which is helpful when performing multiply-accumulate (MAC) instructions common in DSP routines. Besides the 48-bit input from multiplier 85, accumulator, rounding, and logic unit 86 has a 56-bit input from an output of a shifter 90, a 56-bit input from outputs of a 56-bit A register 87 and a 56-bit B register 88, and a 56-bit output to A register 87 and B register 88. A register 87 and B register 88 each have an output connected to an input of shifter 90 as well, and outputs connected to a shifter/limiter 89. Together, blocks 86–90 function to perform additional, non-multiplication arithmetic functions making up the instruction set of DSP 60.

There is a tradeoff between register and bus size on the one hand, and arithmetic hardware size on the other hand. Because of these inherent tradeoffs, the arithmetic hardware size is optimally larger than the internal bus and register size. However, this size difference causes quantization effects to occur when DSP 60 performs certain signal processing functions.

In data ALU 80, for example, shifter/limiter 89 converts the 56-bit outputs of A register 87 and B register 88 back into a form suitable for storing in other hardware of DSP 60, namely 24 bits. When a fractional two's complement number system is used, shifter/limiter 89 truncates a lower 24 bits of the 56-bit result, and thus only the least-significant bits are lost. This conversion is frequently tolerable for two reasons. First, data ALU 80 often performs MAC instructions, and only outputs a result after a large number of cycles. Thus, the higher 56-bit resolution is maintained during the sequence of MAC instructions, and the only conversion loss occurs after the sequence is complete. Second, data ALU often performs saturation arithmetic, in other words, a sequence of MAC instructions will cause the result to reach the positive or negative maximum value. In this case, conversion from 56-bit resolution to 24-bit resolution causes no quantization error.

Figure 4:
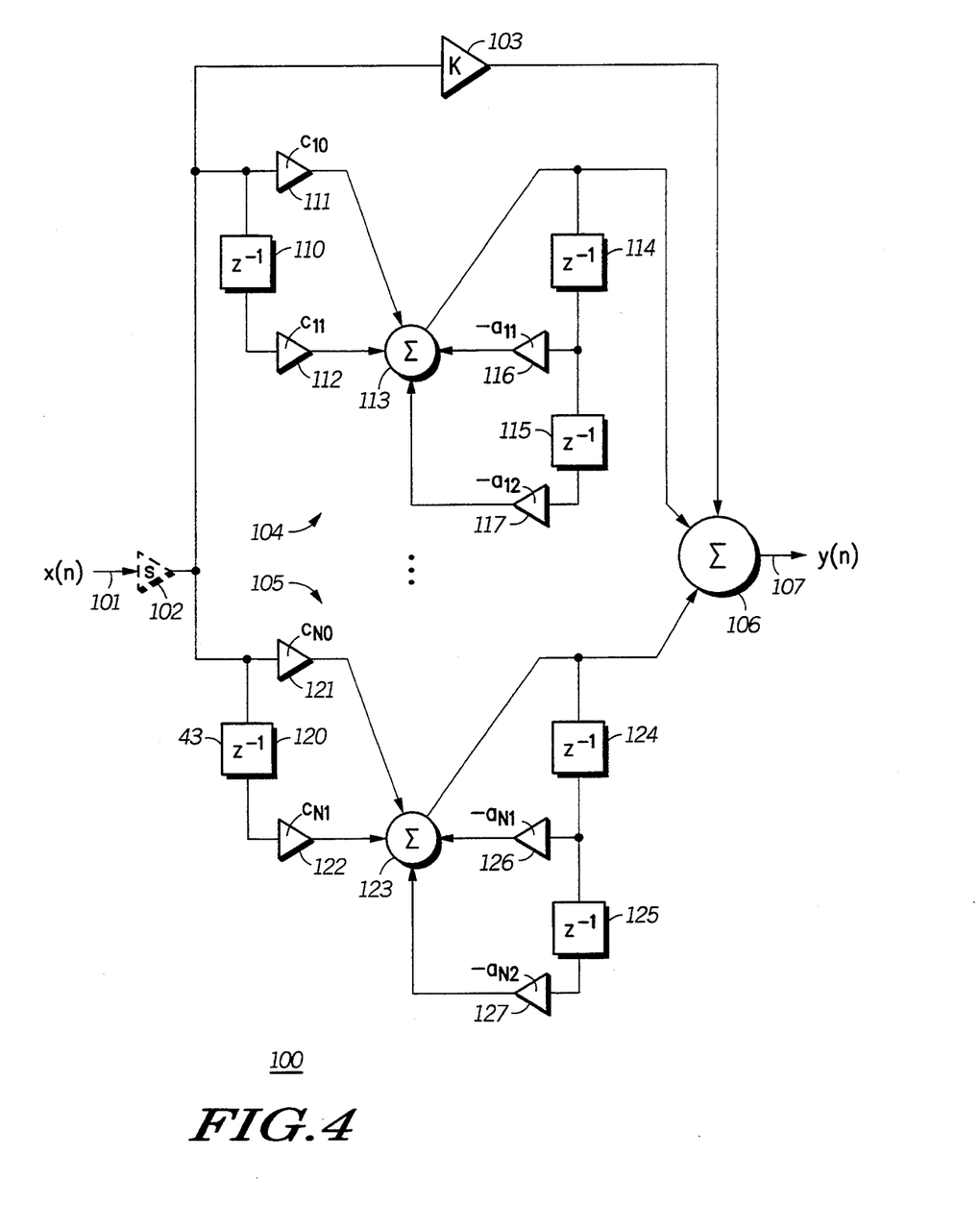
FIG. 4 illustrates in partial block diagram and partial logic diagram form a parallel IIR filter according to the present invention.

FIG. 4 illustrates in partial block diagram and partial logic diagram form a parallel IIR filter 100 according to the present invention. FIG. 4 retains the names of signals corresponding to signals of FIG. 2. Filter 100 includes generally an input terminal 101, multipliers 102 and 103, N biquad filters including representative biquad filters 104 and 105, a summing device 106, and an output terminal 107. Input terminal 101 is an input terminal for receiving the digital signal to be filtered, x(n). Multiplier 102 has an input terminal for receiving signal x(n), and an output terminal for providing a digital signal equal to input signal x(n) multiplied by a coefficient labelled "s". Multiplier 103 has an input terminal connected to the output terminal of multiplier 102, and an output terminal for providing a digital signal equal to the input thereof multiplied by coefficient K. Each biquad filter, including biquad filters 104 and 105, has an input terminal connected to the output terminal of multiplier 102, and an output terminal. Summing device 106 has a first input terminal connected to the output terminal of multiplier 103, N additional input terminals connected to output terminals of each of the N biquad filters in IIR filter 100, and an output terminal connected to output terminal 26 for providing digital output signal y(n).

Biquad filter 104 includes a delay element 110, multipliers 111 and 112, a summing device 113, delay elements 114 and 115, and multipliers 116 and 117. Delay element 110 has an input terminal connected to the output terminal of multiplier 102, and an output terminal. Multiplier 111 has an input terminal connected to the output terminal of multiplier 102, and an output terminal for providing a digital signal equal to an input thereof multiplied by coefficient $c_{10}$. Multiplier 112 has an input terminal connected to the output terminal of delay element 110, and an output terminal for providing a digital signal equal to an input thereof multiplied by coefficient $c_{11}$. Summing device 113 has a first input terminal connected to the output terminal of multiplier 111, a second input terminal connected to the output terminal of multiplier 112, third and fourth input terminals, and an output terminal. Delay element 114 has an input terminal connected to the output terminal of summing device 113, and an output terminal. Delay element 115 has an input terminal connected to the output terminal of delay element 114, and an output terminal. Multiplier 116 has an input terminal connected to the output terminal of delay element 114, and an output terminal connected to the third input terminal of summing device 113 for providing a digital signal equal to an input thereof multiplied by coefficient $-a_{11}$. Multiplier 117 has an input terminal connected to the output terminal of delay element 115, and an output terminal connected to the fourth input terminal of summing device 113 for providing a digital signal equal to an input thereof multiplied by coefficient $-a_{12}$.

Each biquad filter in IIR filter 100 is structurally identical to filter 104, but has different coefficients associated therewith. For example, biquad filter 105 includes delay element 120, multipliers 121 and 122, a summing device 123, delay elements 124 and 125, and multipliers 126 and 127. Each of elements 120–127 corresponds to elements 110–117 and the structure of biquad 105 will not be further discussed. Biquad filter 105 differs from biquad filter 104 in that multipliers 121, 122, 126, and 127 have coefficients $c_{N0}$, $c_{N1}$, $-a_{N1}$, and $-a_{N2}$, respectively, associated therewith.

In filter 100, input data x(n) is optionally scaled down in multiplier 102 before being provided to each biquad filter. Filter 100 includes biquad filters that require only one accumulator (113), three delay units (110, 114, and 115), and four coefficients (111, 112, 116, and 117), and no output scaling factor. Since delay elements 110, 114, and 115 always receive a 24-bit input from memory, the only quantization error occurs at the output terminal of summing device 113. Thus, with N biquad filters, filter 100 causes only N+1 quantization errors. This amount of quantization error is significantly less than the 4N+1 quantization errors of filter 20; thus filter 100 significantly reduces noise. This noise reduction, in theory, is equal to at least 6 decibels (dB).

Filter 100 also eliminates the scaling applied at the output of each biquad filter. Non-overflow of the DSP's accumulator is guaranteed when the parallel-form filter coefficients are calculated as disclosed below, if it is assumed that the original cascade filter does not overflow for any value of x(n). In practice, due to noise distribution in different cases, optional input scaling performed by multiplying input signal x(n) in multiplier 102 by a scaling factor designated "s" may be required. To simplify filter implementation, input scaling factor s may be combined with the coefficients ($c_{i0}$, $C_{i1}$) of the numerator of each biquad filter. By using only one accumulator for each biquad filter and combining input scaling factor s with the numerators of each biquad filter, filter 100 reduces the number of instruction cycles and the memory space required by about 30% and 20%, respectively, when compared with filter 20 of FIG. 1.

Figure 5:
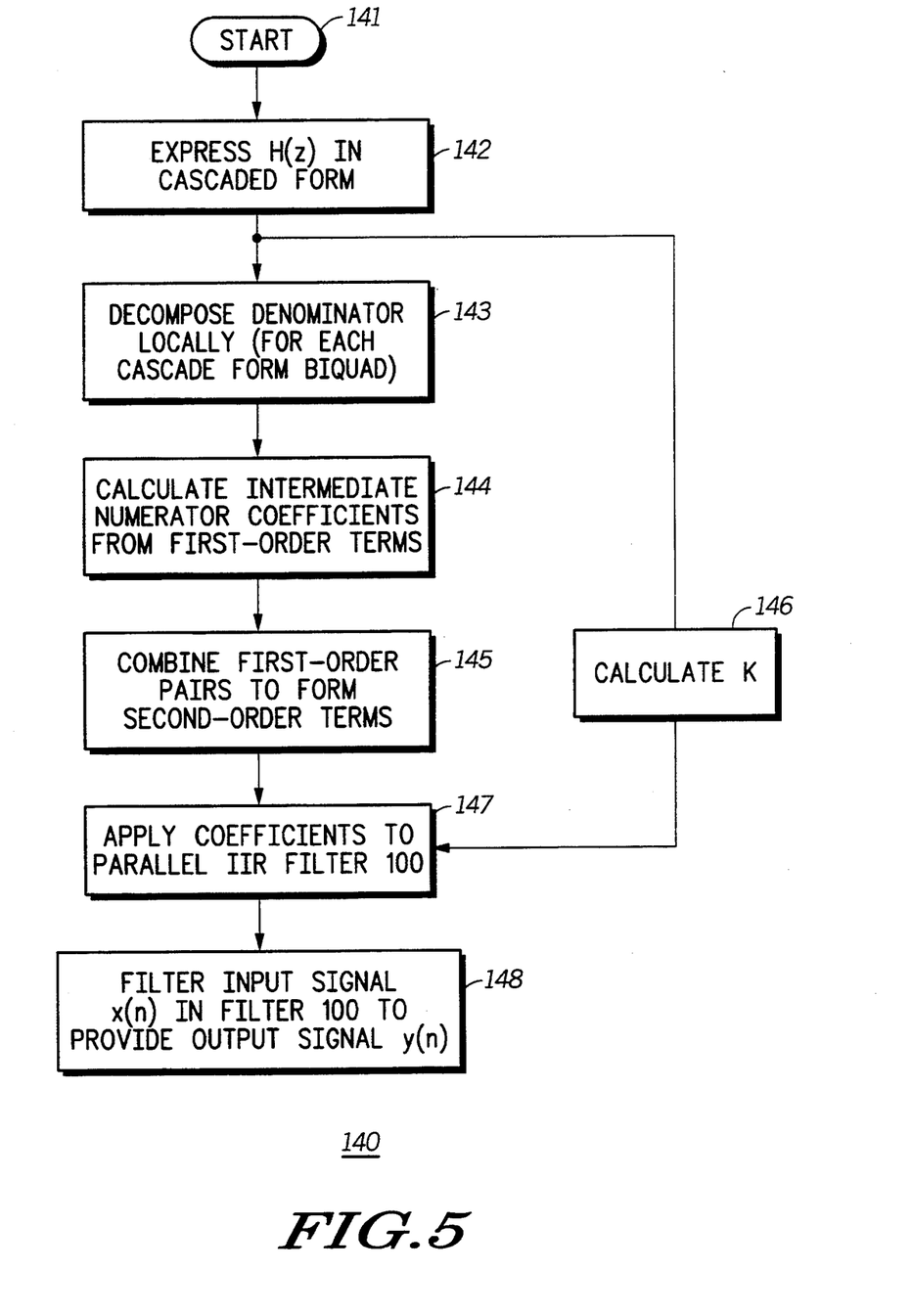
FIG. 5 illustrates a flow chart for determining coefficients for use in the parallel IIR filter of FIG. 4.

FIG. 5 illustrates a flow chart 140 for determining coefficients for use in the parallel IIR filter of FIG. 4. Starting the process at step 141, the transfer function H(z) is first expressed in cascade form at step 142 as:

$$H(z) = \prod_{i=1}^{N} \left( \frac{b_{i0} + b_{i1} z^{-1} + b_{i2} z^{-2}}{1 + a_{i1} z^{-1} + a_{i2} z^{-2}} \right) \quad [2]$$

where H(z) represents the product of N terms, i.e. N biquad filters. The roots of the numerators form the zeros of H(z), and the roots of the denominators form the poles of H(z).

Next, at step 143, the denominator of H(z) as expressed in equation [2] is decomposed locally. That is, the denominator of H(z) is decomposed for each biquad to provide a pair of first-order terms. Because the numerators for the parallel filter are computed from the roots of the denominators, it is not necessary to find the roots of the numerators from equation [2].

Next, at step 144, the numerator coefficients are calculated from each first-order term. After decomposition of the denominator, equation [2] can be rewritten in the following way:

$$H(z) = \frac{\prod_{i=1}^{N} (b_{i0} + b_{i1} z^{-1} + b_{i2} z^{-2})}{\prod_{j=1}^{2N} (1 + d_j z^{-1})} \quad [3]$$

$$= K + \frac{n_1}{1 + d_1 z^{-1}} + \frac{n_2}{1 + d_2 z^{-1}} + \ldots + \frac{n_{2N}}{1 + d_{2N} z^{-1}}$$

In equation [3], K and $n_i$ (for i=1 to 2N) are the coefficients that must be determined. In the process of determining $n_i$, K is not involved. Therefore, K may be calculated separately. In general, numerator coefficient $n_i$ can be written as shown in equation [4]:

$$n_i = \left. \frac{\prod_{i=1}^{N} (b_{i0} + b_{i1} z^{-1} + b_{i2} z^{-2})}{\prod_{k=1, j \neq k}^{2N} (1 + d_j z^{-1})} \right|_{z^{-1} = -1/d_j} \quad [4]$$

Note that (3N−1) and (4N−3) multiplications are required for the numerator and denominator, respectively.

As an intermediate step, at step 145, the first-order pairs are combined to form the second-order terms. The conjugate pairs are multiplied with each other by cross-multiplying numerators and denominators. In filter 100, the denominator coefficients are the same as they would be in the cascade filter expressed in equation [2].

In parallel, at step 146, coefficient K is determined from the $b_{i0}$ terms from equation [2]. The step 146 calculation is straightforward since K and $b_{i0}$ have a very simple relationship, as shown in equation [5]:

$$K = \prod_{i=1}^{N} b_{i0} \quad [5]$$

Therefore, step 146 requires N multiplications to compute K.

Next, at step 147, coefficients $c_{i0}$ and $c_{i1}$ as determined at step 145 and coefficients $-a_{i1}$ and $-a_{i2}$ as determined from the original cascade filter coefficients, are applied to multipliers 111, 112, 116, and 117, respectively, and corresponding multipliers in each biquad, for (i=1 to N). Furthermore, coefficient K is applied to multiplier 103.

Having thus determined the coefficients using steps 142–146 and applied these coefficients to filter 100 at step 147, filter 100 then filters input signal x(n) to provide output signal y(n) for each sample (i.e., each value of n) at step 148. These parallel-form coefficients obtained from the process illustrated in flow chart 140 minimize quantization error when used in filter 100. The process of flow chart 140 computes coefficient K using only N multiplications, while the conventional decomposition requires (2N+1) divisions, (2N−1) multiplications, and (2N−1) additions.

Also the roots of the denominators are obtained locally, that is, only second order polynomials are involved in the decomposition. The conventional process expands all the second order polynomial into a 2N-order polynomial, then determines the roots from the 2N-order polynomial. This conventional process causes many truncation errors, even when using double precision floating-point arithmetic.

Thus, IIR filter 100 reduces quantization errors due to improved polynomial decomposition and to improved biquad filter structures. The result is that filter 100 provides a signal-to-noise ratio which is about 6 dB more than for known IIR filters. In addition, the reduced number of arithmetic operations of IIR filter 100 decreases the number of computation cycles and the amount of memory required. Thus, IIR filter 100 may be implemented using commercially available DSPs.

By way of example, APPENDIX A is a listing of a high-level language software routine for determining the coefficients to be applied to filter 100 using the process outlined in flow chart 140. The software in APPENDIX A is written in the high-level programming language sold under the trademark MATLAB available from MathWorks, Inc., and uses several of its standard routines. The coefficient calculation routine may also be implemented with other programming languages such as C. In the illustrated embodiment, IIR filter 100 of FIG. 4 is performed by DSP 60 of FIGS. 2 and 3 under the control of software. Such signal processing software is well known and will vary for different DSPs. In other embodiments, filter 100 may be implemented with a different combination of hardware and software.

Although the denominator of each biquad term of H(z) is most often normalized as expressed in equation [2], H(z) may occasionally be provided with denominators of each biquad term in the form of $(a_{i0}+a_{i1}z^{-1}+a_{i2}z^{-2})$. In this case, step 146 calculates K as the product of $b_{i0}/a_{i0}$ for $i=1$ to N. Evaluation of this expression for K requires either N divisions and N multiplications, or 2N multiplications and one division. In most filter design packages, however, $a_{i0}$ is normalized to 1. Therefore, only N multiplications are required in the evaluation of K.

While the invention has been described in the context of a preferred embodiment, it will be apparent to those skilled in the art that the present invention may be modified in numerous ways and may assume many embodiments other than that specifically set out and described above. For example, an IIR filter according to the present invention may be performed with hardware, software running on a digital signal processor, or some combination of the two. Also, the polynomial decomposition process may be performed using a different DSP than that illustrated. In addition, a single biquad filter according to the present invention reduces quantization error even when used in other filtering systems than parallel IIR filters. Accordingly, it is intended by the appended claims to cover all modifications of the invention which fall within the true spirit and scope of the invention.

APPENDIX A

```
function [newnum,r,p,k]=partf(num,dem,order)

% partf does partial fraction of a polynomial,

% numerator is array that contains coefficients of numerator,

% denominator is array that contains coefficients of denominator;

% order are number of biquads in numerator and denominator and it

% must be times of two.

% Example H(z) = {(a01+a11z^-1+a21z^-2)/(1+b11z^-1+b21z^-2)}

%         *{(a02+a12z^-1+a22z^-2)/(1+b12z^-1+b22z^-2)};

% numerator[]=[a01 a11 a12 a02 a12 a22] and denominator[]=

% [1 b11 b21 1 b12 b22].

% The output of partf H(z)=1+(e01+e11z^-1)/(1+b11z^-1+b21z^-2) +

% (e02+e12z^-1)/(1+b12z^-1+b22z^-2)

%nroot=zeros(2*order,1);

%droot=zeros(2*order,1);

for i=1:order              % decompose to single root j=i*2-1;

tmp=roots(num(i:i,:));

tmp1=roots(dem(i:i,:));

nroot(j)=tmp(1);

nroot(j+1)=tmp(2);

droot(j)=tmp1(1);

droot(j+1)=tmp1(2);

end;

for i=1:2*order x=droot(i);          % for z^-1 reason we need 1/x
```

```
        ndiff=x-nroot;           % since nroot is negative from ROOTS(),
                                 % -nroot must be used
        tmp=ndiff(1);
        ddiff=x-droot;           % handle denominator
        ddiff(i)=1.0             % this element is zero, set to 1 so no
        tmp1=ddiff(1);           % contribution to multiply for j=2:2*order
                tmp=ndiff(j)*tmp;
                tmp1=ddiff(j)*tmp1;
        end;
        r(i)=tmp/tmp1;
end;
        r=r';
        s=size(nroot,2);
        s1=size(droot,2);        % column size
        k=1;
        l=1;
for i=1:s                        % calculate K
        k=k*nroot(i);
end;
p=droot';
for j=1:order,i=(2*j)-1;
        newnum(j:j,:)=conv(r(i),[1,-p(i+1)])+conv(r(i+1),[1,-p(i)]);
end;
```

We claim:

1. A parallel infinite impulse response (IIR) filter with low quantization effects, comprising:

a multiplier having a constant associated therewith, an input terminal for receiving a digital signal, and an output terminal for providing a first intermediate signal;

a plurality of digital biquad filters, each digital biquad filter having an input terminal for receiving said digital signal, and an output terminal for providing a corresponding intermediate biquad signal;

an output summing device, having a first input terminal coupled to said output terminal of said multiplier, second input terminals coupled to output terminals of corresponding ones of said plurality of digital biquad filters, and an output terminal for providing an output signal of the parallel IIR filter; and processing means for providing coefficients to each of said plurality of digital biquad filters, said processing means comprising:

expression means for expressing a transfer function of the parallel IIR filter as a cascaded IIR filter transfer function, said cascaded IIR filter transfer function being a product of a plurality of cascade form biquad terms, each cascade form biquad term having a numerator and a denominator;

decomposition means for decomposing each cascade form biquad term to provide a pair of first-order terms of a plurality of first-order terms corresponding thereto;

calculation means for calculating first and second intermediate numerator coefficients for each first-order term;

combination means for combining pairs of said plurality of first-order terms to provide a plurality of parallel-form biquad terms; and application means for applying first and second numerator coefficients and first and second denominator coefficients of each parallel form biquad term to corresponding ones of said plurality of digital biquad filters of the parallel IIR filter, the parallel IIR filter filtering said digital signal to provide said output signal using said plurality of digital biquad filters as determined by corresponding first and second numerator coefficients and corresponding first and second denominator coefficients.

2. The parallel IIR filter of claim 1 further comprising second calculation means for calculating said constant as a product of a constant term of each of said plurality of cascade form biquad terms, wherein said application means further applies said constant to said multiplier, the parallel IIR filter filtering said digital signal further using said multiplier as determined by said constant.

3. The parallel IIR filter of claim 1, wherein said processing means comprises:
 a program memory for storing a plurality of instructions; and
 a data processor operatively coupled to said program memory and responsive to said plurality of instructions.

4. The parallel IIR filter of claim 3, wherein said data processor comprises a digital signal processor.

5. The parallel IIR filter of claim 1, wherein each digital biquad filter comprises:
 a summing device having first, second, third, and fourth input terminals, and an output terminal for providing an output signal of the digital biquad filter;
 a first multiplier having an input terminal for receiving said digital signal, and an output terminal coupled to said first input terminal of said summing device, said first multiplier multiplying an input thereof by a corresponding first numerator coefficient to provide an output thereof to said output terminal of said first multiplier;
 a first delay element having an input terminal for receiving said digital signal, and an output terminal;
 a second multiplier having an input terminal coupled to said output terminal of said first delay element, and an output terminal coupled to said second input terminal of said summing device, said second multiplier multiplying an input thereof by a corresponding second numerator coefficient to provide an output thereof to said output terminal of said second multiplier;
 a second delay element having an input terminal coupled to said output terminal of said summing device, and an output terminal;
 a third multiplier having an input terminal coupled to said output terminal of said second delay element, and an output terminal coupled to said third input terminal of said summing device, said third multiplier multiplying an input thereof by a corresponding first denominator coefficient to provide an output thereof to said output terminal of said third multiplier;
 a third delay element having an input terminal coupled to said output terminal of said second delay element, and an output terminal; and
 a fourth multiplier having an input terminal coupled to said output terminal of said third delay element, and an output terminal coupled to said fourth input terminal of said summing device, said fourth multiplier multiplying an input thereof by a corresponding second denominator coefficient to provide an output thereof to said output terminal of said fourth multiplier.

6. A parallel infinite impulse response (IIR) filter with low quantization effects, comprising:
 a multiplier having a constant associated therewith, an input terminal for receiving a digital signal, and an output terminal for providing a first intermediate signal;
 a plurality of digital biquad filters, each digital biquad filter having an input terminal for receiving said digital signal, and an output terminal for providing a corresponding intermediate biquad signal;
 an output summing device having a first input terminal coupled to said output terminal of said multiplier, second input terminals coupled to output terminals of corresponding ones of said plurality of digital biquad filters, and an output terminal for providing an output signal of the IIR filter; and
 a data processing apparatus operatively coupled to said multiplier, said data processing apparatus expressing a transfer function of the parallel IIR filter as a cascade form transfer function, said cascade form transfer function being a product of a plurality of cascade form biquad terms, each cascade form biquad term having a numerator and a denominator, said data processing apparatus further calculating said constant as a product of a constant term of each of said plurality of cascade form biquad terms and applying said constant to the multiplier,
 the parallel IIR filter filtering said digital signal using said multiplier as determined by said constant.

7. The parallel IIR filter of claim 6, wherein said data processing apparatus comprises:
 expression means for expressing a transfer function of the parallel IIR filter as a cascaded IIR filter transfer function, said cascaded IIR filter transfer function being a product of a first predetermined number of biquad terms, each biquad term having a numerator and a denominator;
 calculation means for calculating said constant as a product of a constant term of each of said plurality of cascade form biquad terms; and
 application means for applying said constant to the parallel IIR filter.

8. The parallel IIR filter of claim 6, wherein said data processing apparatus comprises:
 a program memory for storing a plurality of instructions; and
 a data processor operatively coupled to said program memory and responsive to said plurality of instructions.

9. The parallel IIR filter of claim 8 wherein said data processor is characterized as being a digital signal processor.

10. A method for filtering a digital input signal using a parallel infinite impulse response (IIR) filter, comprising the steps of:
 expressing a transfer function of the parallel IIR filter as a cascade form transfer function, said cascade form transfer function being a product of a plurality of cascade form biquad terms, each cascade form biquad term having a numerator and a denominator;
 decomposing each cascade form biquad term to provide a pair of first-order terms of a plurality of first-order terms corresponding thereto;
 calculating first and second intermediate numerator coefficients for each first-order term;
 combining pairs of said plurality of first-order terms to provide a plurality of parallel form biquad terms;
 applying first and second numerator coefficients and first and second denominator coefficients of each parallel form biquad term to corresponding ones of a plurality of biquad filters of the parallel IIR filter; and filtering a digital input signal with the parallel IIR filter to provide a digital output signal using said plurality of biquad filters as determined by corresponding first and second numerator coefficients and corresponding first and second denominator coefficients.

11. The method of claim 10 further comprising the steps of:

calculating a constant from said numerator of each of said plurality of cascade form biquad terms; and applying said constant to a multiplier of the parallel IIR filter; and wherein said step of filtering comprises the step of filtering said digital input signal of the parallel IIR filter further using said multiplier as determined by said constant.

12. The method of claim 10 further comprising the step of performing said steps of expressing, decomposing, calculating, combining, and applying with a data processing apparatus.

13. The method of claim 12 wherein said step of performing said steps of expressing, decomposing, calculating, combining, and applying with a data processing apparatus further comprises the step of performing said steps of expressing, decomposing, calculating, combining, and applying with a digital signal processor (DSP).

14. A method for filtering a digital input signal using a parallel infinite impulse response (IIR) filter, comprising the steps of:

expressing a transfer function of the parallel IIR filter as a cascaded IIR filter transfer function, said cascaded IIR filter transfer function being a product of a plurality of cascade form biquad terms, each cascade form biquad term having a numerator and a denominator;

calculating a parallel form constant by multiplying together constants of numerators of each of said plurality of cascade form biquad terms;

applying said parallel form constant to a multiplier of the parallel IIR filter; and filtering a digital input signal with the parallel IIR filter to provide a digital output signal using said multiplier as determined by said parallel form constant.

15. The method of claim 14 further comprising the step of performing said steps of expressing, calculating, and applying with a data processing apparatus.

16. The method of claim 15 wherein said step of performing said steps of expressing, calculating, and applying with a data processing apparatus further comprises the step of performing said steps of expressing, calculating, and applying with a digital signal processor (DSP).

* * * * *